(12) United States Patent
Lo et al.

(10) Patent No.: US 10,423,548 B2
(45) Date of Patent: Sep. 24, 2019

(54) MEMORY CONTROLLER, CONTROL METHOD FOR THE MEMORY CONTROLLER, AND CONTROL METHOD FOR MEMORY

(71) Applicant: Industrial Technology Research Institute, Hsinchu (TW)

(72) Inventors: Chih-Yen Lo, Hsinchu (TW); Jenn-Shiang Lai, Miaoli County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 136 days.

(21) Appl. No.: 15/853,655

(22) Filed: Dec. 22, 2017

(65) Prior Publication Data

US 2019/0155764 A1 May 23, 2019

(30) Foreign Application Priority Data

Nov. 17, 2017 (TW) .............................. 106139888 A

(51) Int. Cl.
*G06F 13/16* (2006.01)
*G11C 11/409* (2006.01)
(Continued)

(52) U.S. Cl.
CPC ...... *G06F 13/1689* (2013.01); *G06F 13/1694* (2013.01); *G11C 11/406* (2013.01);
(Continued)

(58) Field of Classification Search
CPC ............. G06F 13/1689; G06F 13/1694; G11C 11/409; G11C 11/4076; G11C 11/406
See application file for complete search history.

(56) References Cited

U.S. PATENT DOCUMENTS 5,511,033 A 4/1996 Jung
5,583,823 A 12/1996 Park
(Continued)

FOREIGN PATENT DOCUMENTS

CN 1184644 C 1/2005
CN 1702767 A 11/2005
(Continued)

OTHER PUBLICATIONS

Taiwan Patent Office, Patent Application Serial No. 106139888, dated Jun. 27, 2018, Taiwan.
(Continued)

*Primary Examiner* — Henry Tsai
*Assistant Examiner* — Christopher Daley

(57) ABSTRACT

A memory controller accessing a memory including a plurality of blocks is provided. The memory controller includes a storage circuit and a control circuit. The storage circuit stores a refresh value and a data table. The data table has a plurality of bits. Each bit indicates whether a corresponding block has valid data. The control circuit selects a specific block according to the refresh value and determines whether the specific block stores valid data according to the data table. When the specific block stores valid data, the control circuit accesses the memory after a first waiting time. When the specific block does not store any data or stores invalid data, the control circuit accesses the memory after a second waiting time. The second waiting time is shorter than the first waiting time.

37 Claims, 6 Drawing Sheets

(51) Int. Cl.
*G11C 11/4076* (2006.01)
*G11C 11/406* (2006.01)

(52) U.S. Cl.
CPC ........ *G11C 11/409* (2013.01); *G11C 11/4076* (2013.01); *G11C 11/40611* (2013.01); *G11C 11/40618* (2013.01)

(56) References Cited

U.S. PATENT DOCUMENTS

| | | | |
|---|---|---|---|
| 6,587,918 | B1 | 7/2003 | Christenson |
| 6,934,211 | B2 | 8/2005 | Hazama et al. |
| 6,948,029 | B2 | 9/2005 | Yano |
| 7,295,484 | B2 | 11/2007 | Cruz et al. |
| 8,072,829 | B2 | 12/2011 | Kim |
| 8,631,194 | B2 * | 1/2014 | Wakasa ................ G11C 11/406 711/106 |
| 9,058,896 | B2 | 6/2015 | Franceschini et al. |
| 9,224,449 | B2 | 12/2015 | Dally |
| 9,490,001 | B2 * | 11/2016 | Kim ...................... G11C 11/402 |
| 2014/0063997 | A1 * | 3/2014 | Franceschini .... G11C 29/50016 365/201 |
| 2016/0179613 | A1 * | 6/2016 | Suto .................... G06F 11/1048 714/773 |
| 2016/0188529 | A1 * | 6/2016 | Nagarajan ........... G06F 12/0813 711/151 |
| 2016/0283150 | A1 * | 9/2016 | Kogita ............... G11C 16/3431 |
| 2017/0091087 | A1 * | 3/2017 | Cui ..................... G11C 11/4091 |
| 2019/0087125 | A1 * | 3/2019 | Matsumoto ........... G06F 3/0659 |

FOREIGN PATENT DOCUMENTS

| | | |
|---|---|---|
| CN | 103915110 A | 7/2014 |
| TW | 416032 | 12/2000 |
| TW | 201510999 | 3/2015 |

OTHER PUBLICATIONS

Jedec Standard. Low Power Double Data Rate 4 (LPDDR4), JESD209-4, Jedec Solid State Technology Association, Aug. 2014, 196 pages.

* cited by examiner

MEMORY CONTROLLER, CONTROL METHOD FOR THE MEMORY CONTROLLER, AND CONTROL METHOD FOR MEMORY

CROSS REFERENCE TO RELATED APPLICATIONS

This Application claims priority of Taiwan Patent Application No. 106139888, filed on Nov. 17, 2017, the entirety of which is incorporated by reference herein.

BACKGROUND OF THE INVENTION

Field of the Invention

The disclosure relates to a memory controller, a control method for the memory controller, and a control method for the memory.

Description of the Related Art

A system memory is configured to store data from a central processing unit (CPU) and various peripheral components. Usually, as the capacity of system memory increases, the efficiency of the computer system increases accordingly. One commonly used system memory is dynamic random access memory (DRAM). In DRAM, the storage unit generally includes a transistor and a capacitor to store a bit data. Since there are various leakage paths surrounding the transistor and the capacitor, the storage unit has to periodically refresh the stored data while in standby mode. That is the reason that it is called "dynamic."

BRIEF SUMMARY OF THE INVENTION

In accordance with an embodiment, a memory controller accesses a memory comprising a plurality of memory blocks and comprises a storage circuit and a control circuit. The storage circuit stores a refresh value and a data table. The control circuit accesses the memory blocks and changes the data table according to external commands. The data table comprises a plurality of bits. Each bit indicates whether a corresponding memory block stores valid data. In a refresh mode, the control circuit selects a specific memory block among the memory blocks according to the refresh value and determines whether the specific memory block stores valid data according to the data table. When the specific memory block stores valid data, the control circuit sends a refresh command to the memory and, after a first waiting time, the control circuit continuously accesses the memory. When the specific memory block does not store any data or stores invalid data, the control circuit sends the refresh command and, after a second waiting time, the control circuit continuously accesses the memory. The second waiting time is shorter than the first waiting time.

In accordance with a further embodiment, a control method for a memory controller, which accesses a memory comprising a plurality of memory blocks, comprises determining whether a refresh request is issued. When the refresh request is issued, a refresh value is read to select a specific memory block among the memory blocks. A data table is read to notify whether the specific memory block stores valid data. A refresh command is sent to the memory and, after a first waiting time, the memory is accessed when the specific memory block stores valid data. The refresh command is sent to the memory and, after a second waiting time, the memory is accessed when the specific memory block does not store valid data or stores invalid data. The second waiting time is shorter than the first waiting time. Then, the refresh value is updated.

In accordance with an embodiment, a memory coupling to a memory controller comprises a plurality of memory blocks, a storage circuit, and a control circuit. The memory blocks are configured to store data. The storage circuit stores a refresh value and a data table. The control circuit accesses the memory blocks, and updates the refresh value and the data table. The data table comprises a plurality of bits and each bit indicates whether a corresponding memory block stores valid data. When the control circuit receives a refresh command, the control circuit selects a specific memory block among the memory blocks according to the refresh value and determines whether the specific memory block stores valid data according to the data table. When the specific memory block stores valid data, the control circuit refreshes the specific memory block. When the specific memory block does not store any data or stores invalid data, the control circuit does not refresh the specific memory block.

A control method for a memory is provided. The memory comprises a plurality of memory blocks and is controlled by a memory controller. An exemplary embodiment of the control method is described in the following paragraph. It is determined whether a refresh command is sent from the memory controller. When the refresh command is sent from the memory controller, a refresh value is read to select a specific memory block among the memory blocks. A data table is read to notify whether the specific memory block stores valid data. When the specific memory block stores valid data, the specific memory block is refreshed. When the specific memory block does not store any data or stores invalid data, the specific memory block is not refreshed. The refresh value is updated after the refresh value is read.

Control methods may be practiced by the accessing systems which have hardware or firmware capable of performing particular functions and may take the form of program code embodied in a tangible media. When the program code is loaded into and executed by an electronic device, a processor, a computer or a machine, the electronic device, the processor, the computer or the machine becomes an apparatus for practicing the disclosed control methods or the accessing systems.

BRIEF DESCRIPTION OF THE DRAWINGS

The disclosure can be more fully understood by referring to the following detailed description and examples with references made to the accompanying drawings, wherein.

DETAILED DESCRIPTION OF THE INVENTION

Figure 1:
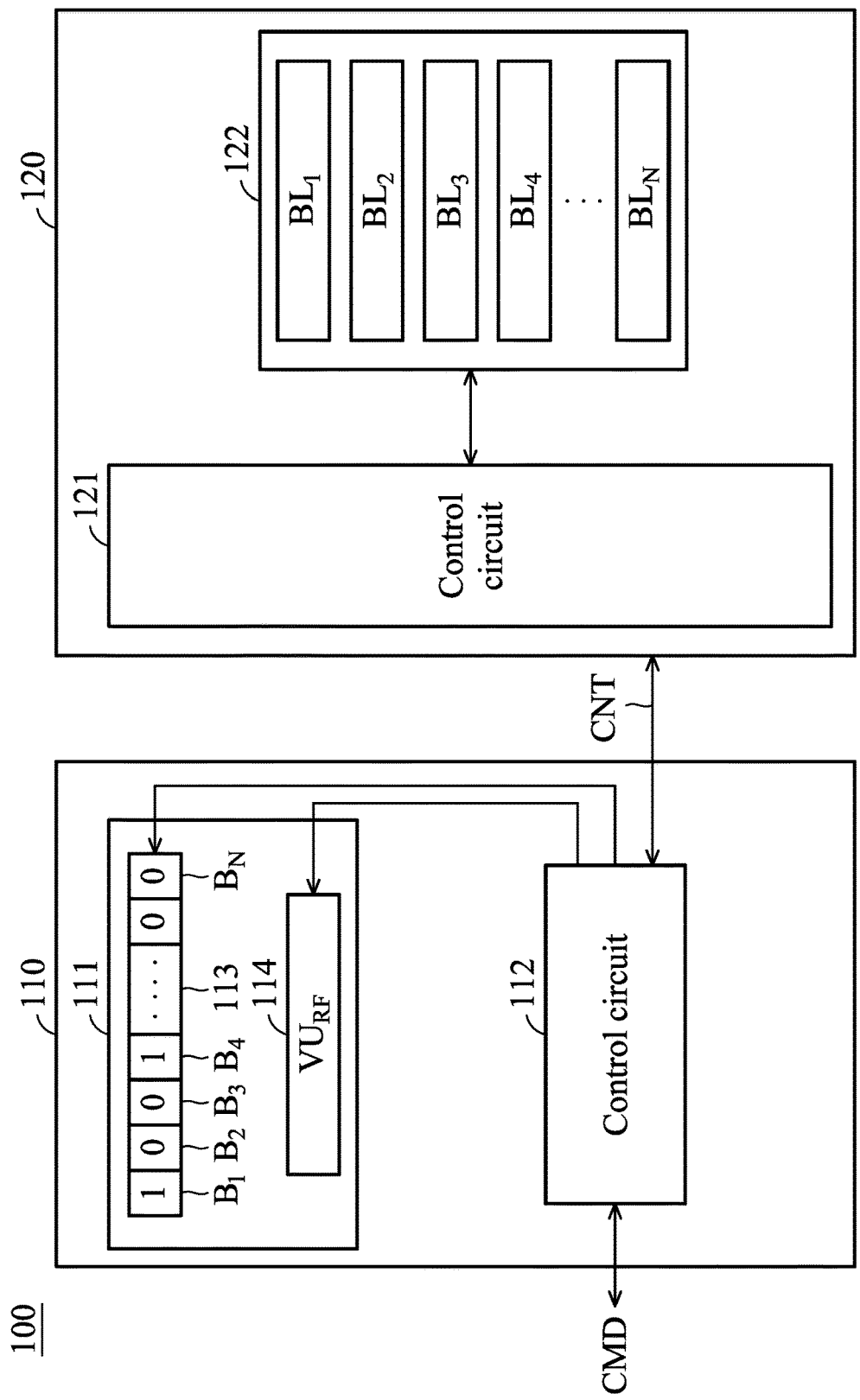
FIG. 1 is a block diagram of an exemplary embodiment of an accessing system, according to various aspects of the present disclosure.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the disclosure.

FIG. 1 is a block diagram of an exemplary embodiment of an accessing system, according to various aspects of the present disclosure. As shown in FIG. 1, the accessing system 100 comprises a memory controller 110 and a memory 120. The memory controller 110 receives an external command CMD and generates a control command CNT according to the external command CMD. The memory 120 receives external data provided by the memory controller 110 or provides read data to the memory controller 110 according to the control command CNT. In one embodiment, the external command CMD is provided by an external circuit (not shown). In this case, the memory controller 110 outputs the read data to the external circuit, wherein the external circuit is disposed outside of the memory controller 110 and outside of the memory 120.

In one embodiment, the memory 120 is a dynamic random access memory (DRAM). In this embodiment, the memory 120 comprises a control circuit 121 and a memory array 122. According to the control command CNT, the control circuit 121 writes external data to the memory array 122, or reads data stored in the memory array 122 and outputs the read data to the memory controller 110. As shown in FIG. 1, the memory array 122 comprises memory blocks $BL_1 \sim BL_N$ configured to store data. Each of the memory blocks $BL_1 \sim BL_N$ comprises a plurality of storage units referred to as memory cells.

In this embodiment, the memory controller 110 comprises a storage circuit 111 and a control circuit 112. The storage circuit 111 stores a data table 113 and a refresh value $VU_{RF}$. The data table 113 comprises bits $BL_1 \sim BL_N$. The value of each of the bits $BL_1 \sim BL_N$ indicates whether a corresponding memory block stores valid data. Assume that the bits $BL_1 \sim BL_N$ correspond to the memory blocks $BL_1 \sim BL_N$ respectively. In this exemplary case, the value of each of the bits $B_1$ and $B_4$ is "1" which means that the memory blocks $BL_1$ and $BL_4$ store valid data. Furthermore, the value of each of the bits $B_2$ and $B_3$ is "0" which means that the memory blocks $BL_2$ and $BL_3$ do not store any data or store invalid data. The number of bits in the data table 113 is not limited in the present disclosure. In one embodiment, the number of bits in the data table 113 is related to the number of memory blocks in the memory 120. In an initial period, the control circuit 112 sets each of the bits $BL_1 \sim BL_N$ to an initial value, such as 0.

In this embodiment, the refresh value $VU_{RF}$ is stored in a refresh address register 114. The refresh value $VR_{RF}$ indicates a refresh sequence for which the memory blocks $BL_1 \sim BL_N$ execute a refresh operation. The control circuit 112 selects which memory block to execute the refresh operation according to the refresh value $VU_{RF}$.

In other embodiments, the memory controller 110 further comprises a timing circuit (not shown) which activates the control circuit 112 to enter a refresh mode. For example, when the counter value of the timing circuit arrives a predetermined value, the timing circuit sends a trigger signal. The control circuit 112 enters a refresh mode according to the trigger signal. In the refresh mode, the control circuit 112 selects at least one specific memory block among the memory blocks $BL_1 \sim BL_N$ according to the refresh value $VU_{RF}$, and determines whether the specific memory block stores valid data according to the data table.

Assume that the control circuit 112 selects the memory block $BL_1$ according to the refresh value $VU_{RF}$. In this case, the control circuit 112 reads the bit $B_1$ of the data table 113 to determine whether the memory block $BL_1$ stores valid data. The value of the bit $B_1$ is 1, which means that the memory block $BL_1$ stores valid data. Therefore, the control command CNT sent from the control circuit 112 is a refresh command. The control circuit 121 of the memory 120 performs a refresh operation on the memory block $BL_1$ according to the refresh command. In one embodiment, the control circuit 121 reads the data stored in the memory block $BL_1$, and then rewrites the data to the memory block $BL_1$. The control circuit 121 performs the refresh operation on the memory block $BL_1$, while simultaneously, the control circuit 112 does not generate any other control commands to the memory 120. After the control circuit 121 finishes the refresh operation, the control circuit 112 then sends other control commands. Therefore, the memory 120 accesses the memory blocks $BL_1 \sim BL_N$ according to these commands.

In another embodiment, when the control circuit 112 selects the memory block $BL_2$ according to the refresh value $VU_{RF}$, the control circuit 112 obtains that the memory block $BL_2$ does not store any data or stores invalid data according to the value ("0") of the bit $B_2$ in the data table 113. Therefore, the control circuit 112 does not send the refresh command to the memory 120, or send an invalid refresh command such that the memory 120 does not perform a refresh operation. In this case, since the control circuit 112 has no need to wait for the memory 120 to perform a refresh operation, the control circuit 112 can immediately send other control commands after a clock cycle. Therefore, the time during which the control circuit 112 waits for the memory 120 to finish the refresh operation is reduced and the operating efficiency of the accessing system 100 is increased.

In other embodiments, the memory controller 110 further comprises a counter circuit (not shown). The counter circuit has a counter value. The counter value is provided as the refresh value $VU_{RF}$. In this case, the control circuit 112 assigns at least one memory block to perform the refresh operation according to the counter value of the counter circuit. After the control circuit 112 reads the counter value of the counter circuit, the control circuit 112 changes the counter value of the counter circuit by increasing or by reducing the counter value. In one embodiment, when the control circuit 112 enters a refresh mode, no matter whether the control circuit 112 sends the refresh command to the memory 120, the control circuit 112 changes the counter value of the counter circuit.

In other embodiments, the memory controller 110 further comprises an interface logic circuit (not shown) configured to receive the external command CMD. The interface logic circuit provides the external command CMD to the control circuit 112. In one embodiment, the interface logic circuit comprises a queue (not shown) configured to store a plurality of external commands CMD. In such cases, the control circuit 112 reads and executes the commands stored in the queue. In some embodiments, the interface logic circuit further comprises a decoder (not shown) to decode the external commands CMD and provide the decoded results to the control circuit 112. In other embodiments, the decoder is disposed inside of the control circuit 112. The disclosure does not limit the type of external command. The external command may be a write command, a read command, an eviction command, a flush command or another command.

When the external command CMD is a first write command, the control circuit 112 enters a write mode. In the write mode, the control command CNT sent from the control circuit 112 is a second write command to write external data to at least one of the memory blocks $BL_1 \sim BL_N$. Assume that the control circuit 121 stores the external data in the memory block $BL_2$. In this case, the control circuit 112 updates the data table 113 according to the write address of the first write command. Therefore, the value of the bit $B_2$ is updated from 0 to 1.

When the external command CMD is a first read command, the control circuit 112 enters a read mode. In the read mode, the control command CNT sent by the control circuit 112 is a second read command. The control circuit 121 reads at least one of the memory blocks $BL_1 \sim BL_N$ according to the second read command. Since the control circuit 121 does not write data to the memory blocks $BL_1 \sim BL_N$, the control circuit 112 does not change the values of the bits $B_1 \sim B_N$ of the data table 113 in the read mode.

When the external command CMD is a first eviction command, the control circuit 112 enters an eviction mode. In the eviction mode, the control circuit 112 sends a control command CNT, which is a second eviction command. The control circuit 121 releases at least one of the memory blocks $BL_1 \sim BL_N$ according to the second eviction command. Assume that the data stored in the memory block $BL_4$ is evicted. In this case, the control circuit 112 updates the value of the bit $B_4$ of the data table 113 from 1 to 0 to indicate that the data stored in the memory block $BL_4$ is invalid data, wherein the bit $B_4$ corresponds to the memory block $BL_4$. In one embodiment, the control circuit 121 of the memory 120 does not clear the data stored in the memory block $BL_4$, but the control circuit 121 uses the memory block $BL_4$ as an idle block. When the control circuit 112 enters the next write mode, the control circuit 121 may write new data to the memory block $BL_4$.

When the external command CMD is a first flush command, the control circuit 112 enters a flush mode. In the flush mode, the control command CNT sent from the control circuit 112 is a second flush command. The control circuit 121 reads at least one memory block according to the second flush command and writes the data, which is read from the memory block, to an external memory (not shown). In this embodiment, the external memory is disposed outside of the memory controller 110 and outside of the memory 120. Assume that the data stored in the memory block $BL_1$ is read. In the flush mode, the control circuit 112 updates the value of the bit $B_1$ of the data table 113 to 0, which means that the data stored in the memory block $BL_1$ is invalid data, wherein the bit $B_1$ corresponds to the memory block $BL_1$. In this case, when the control circuit 112 enters a refresh mode and selects the memory block $BL_1$ according to the refresh value $VU_{RF}$, since the value of the bit $B_1$ in data table 113 has been updated to 0, the control circuit 121 does not perform a refresh operation on the memory block $BL_1$.

Figure 2:
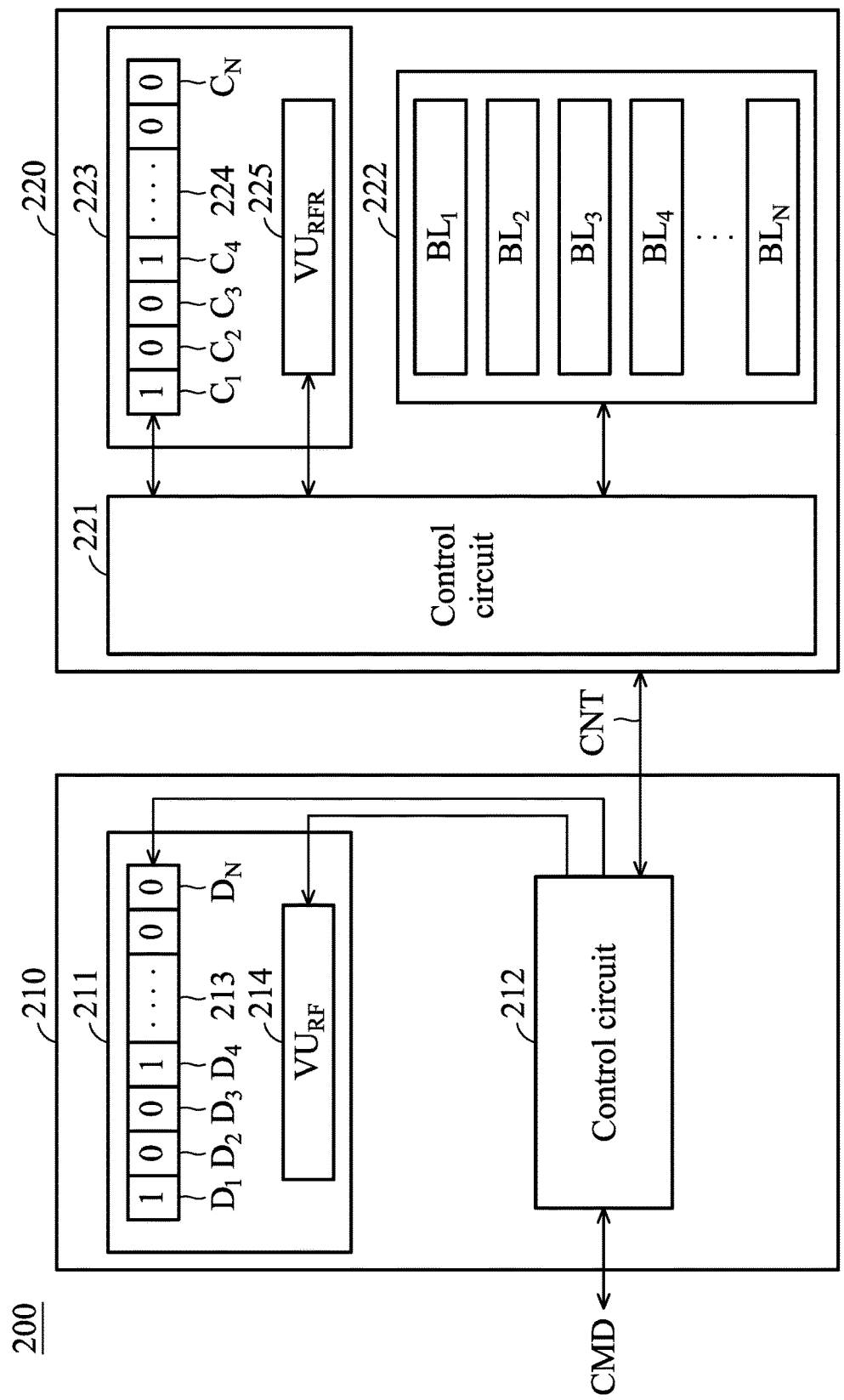
FIG. 2 is a block diagram of another exemplary embodiment of the accessing system, according to various aspects of the present disclosure.

FIG. 2 is a block diagram of another exemplary embodiment of the accessing system, according to various aspects of the present disclosure. FIG. 2 is similar to FIG. 1 except that the memory 220 shown in FIG. 2 further comprises a storage circuit 223. In this embodiment, the storage circuit 223 stores a data table 224 and a refresh value $VU_{RFR}$. The data table 224 has bits $C_1 \sim C_N$. The values of the bits $C_1 \sim C_N$ indicate whether the memory blocks $BL_1 \sim BL_N$ store valid data. In addition, the refresh value $VU_{RFR}$ indicates the sequence for which the memory blocks $BL_1 \sim BL_N$ execute the refresh operation. In this embodiment, the data table 224 and the refresh value $VU_{RFR}$ synchronize with the data table 213 and the refresh value $VU_{RF}$, respectively. In other words, the values of the bits $C_1 \sim C_N$ of the data table 224 are the same as the values of the bits $D_1 \sim D_N$ of the data table 213, and the refresh value $VU_{RFR}$ is the same as the refresh value $VU_{RF}$. Since the features of the storage circuits 211 and 223 are the same as those of the storage circuit 111 shown in FIG. 1, the descriptions of the storage circuits 211 and 223 are omitted.

In this embodiment, when a timing circuit (not shown) of the memory controller 210 sends a trigger signal, the control circuit 212 enters a refresh mode. In the refresh mode, the control circuit 212 reads the refresh value $VU_{RF}$ to select a specific memory block. Assume that the control circuit 212 selects the memory block $BL_1$. In this case, the control circuit 212 obtains that the memory block $BL_1$ stores valid data because the value of the bit $D_1$ of the data table 213 is 1. Therefore, the control command CNT sent from the control circuit 212 is a refresh command. In such a case, the control circuit 221 reads the refresh value $VU_{RFR}$ according to the refresh command to select the memory block $BL_1$. The control circuit 221 obtains that the memory block $BL_1$ stores valid data according to the value "1" of the bit $C_1$ of the data table 224. Therefore, the control circuit 221 performs a refresh operation to the memory block $BL_1$. In this case, the control circuit 212 waits a first waiting time and then sends new control command CNT according to the external command CMD. Meanwhile, the control circuit 221 accesses the memory blocks $BL_1 \sim BL_N$ according to the new control command CNT after the first waiting time.

However, in the refresh mode, if the control circuit 212 selects the memory block $BL_2$ according to the refresh value $VU_{RF}$, the control circuit 212 obtains that the memory block $BL_2$ does not store any data or stores invalid data according to the value "0" of the bit $D_2$ of the data table 213. At this time, the control circuit 212 also sends a refresh command. The control circuit 221 reads the refresh value $VU_{RFR}$ according to the refresh command. Since the refresh value $VU_{RFR}$ is the same as the refresh value $VU_{RF}$, the control circuit 221 also selects the memory block $BL_2$. The control circuit 221 obtains that the memory block $BL_2$ does not store any data or stores invalid data according to the value "0" of the bit $C_2$ of the data table 224. Therefore, the control circuit 221 does not perform a refresh operation on the memory block $BL_2$. In this case, although the control command CNT sent from the control circuit 212 is a refresh command, since the control circuit 221 does not perform a refresh operation on the memory block $BL_2$, the control circuit 212 is capable of sending another control command immediately.

Furthermore, since the control circuit 221 does not perform a refresh operation on the memory block $BL_2$, after a clock cycle, the control circuit 221 immediately executes the control command sent from the memory controller 210 to access the memory blocks $BL_1 \sim BL_N$. Therefore, the efficiency of the accessing system 200 is increased. In other embodiments, even if the control circuit 221 does not perform a refresh operation to the memory block $BL_2$, the control circuit 212 still waits a second waiting time. After the second waiting time, the control circuit 212 sends a new control command. In this case, the second waiting time is greatly less than the first waiting time. Assume that the control circuit 212 sends a control command CNT to the memory 220 according to an input clock (not shown). In this case, the first waiting time is longer than a clock cycle of the input clock, and the second waiting time is equal to a clock cycle.

Figure 3A:
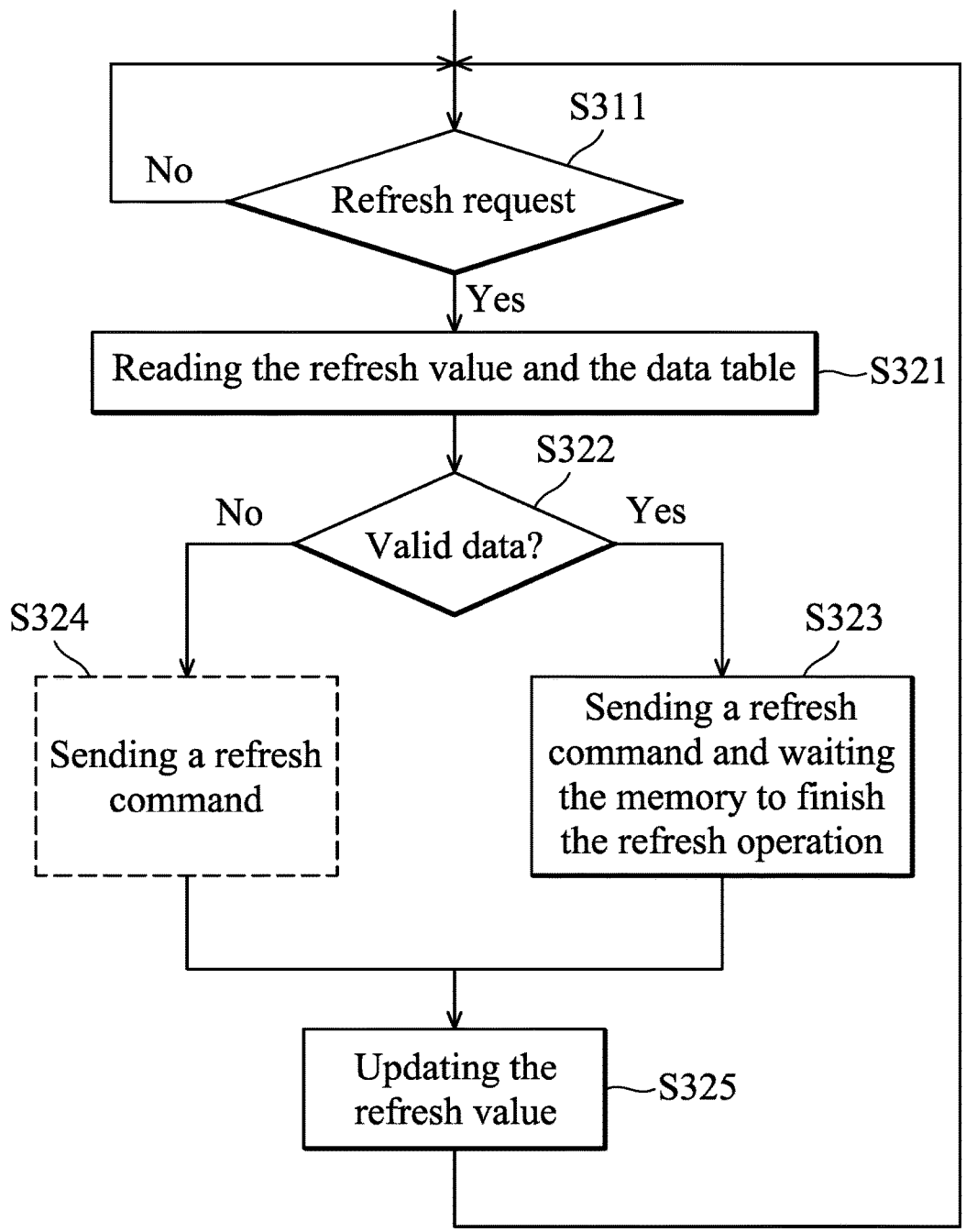
FIG. 3A is a flowchart of an exemplary embodiment of a control method for a memory controller, according to various aspects of the present disclosure.

FIG. 3A is a flowchart of an exemplary embodiment of a control method for a memory controller, according to various aspects of the present disclosure. The control method 300 is applied in a memory controller. The memory controller is configured to access an external memory. The external memory is disposed outside of the memory controller and comprises a plurality of memory blocks. In one embodiment, each memory block comprises a plurality of memory cells.

First, it is determined whether a refresh request is issued (step S311). In one embodiment, the memory controller determines whether a timing circuit disposed in the memory controller issues the refresh request. In this case, the timing circuit counts a predetermined time and then issues the refresh request referred to as a trigger signal.

When the refresh request is issued, a refresh value and a data table are read (step S321). In one embodiment, the memory controller comprises a refresh address register to store the refresh value. In another embodiment, the data table has a plurality of bits. The value of each bit indicates whether a corresponding memory block stores valid data. In some embodiments, in an initial period, the refresh value is written into the memory controller. In this period, each of the values of the data table is reset to an initial value, such as "0".

The refresh value is read to select a specific memory block of the external memory and the data table is read to notify whether the specific memory block stores valid data (step S322). When the specific memory block stores valid data, a refresh command is sent to the external memory such that the external memory performs a refresh operation on the specific memory block (step S323). In one embodiment, after sending the refresh command, the memory controller waits a first waiting time.

When the specific memory block does not store any data or stores invalid data, a refresh command is sent to the external memory (step S324). In this embodiment, since the specific memory block does not store any data or stores invalid data, the external memory has no need to perform a refresh operation on the specific memory block. Therefore, the memory controller can directly send another control command to the external memory such that the efficiency of the memory controller is increased. In another embodiment, when the specific memory block does not store any data or stores invalid data, the memory controller sends the refresh command, waits a second waiting time and then sends another control command to the external memory. In this case, the second waiting time is shorter than the first waiting time. For example, assume that the memory controller sends a refresh command to the external memory according to an input clock. In such a case, the first waiting time is longer than a clock cycle of the input clock, and the second waiting time is equal to a clock cycle. In one embodiment, the external memory performs the refresh operation for at least one specific memory block during the first waiting time. However, the external memory does not perform a refresh operation for any memory block during the second waiting time. In other embodiments, step S324 can be omitted. In this case, when the specific memory block does not store any data or stores invalid data, the memory controller does not send the refresh command.

Next, the refresh value is updated (step S325) to select another memory block for the next refresh request. In one embodiment, the memory controller comprises a counter circuit. The counter value of the counter circuit is provided as a refresh value. In this case, step S321 reads the counter value of the counter circuit. The memory controller selects a corresponding memory block according to the counter value. In one embodiment, each time that a refresh request is issued, the memory controller updates the counter value of the counter circuit. When the next refresh request is issued, the memory controller selects another memory block according to the updated counter value. The present disclosure does not limit how the memory controller updates the counter value. In one embodiment, the memory controller incrementally increases or decreasingly reduces the counter value.

Figure 3B:
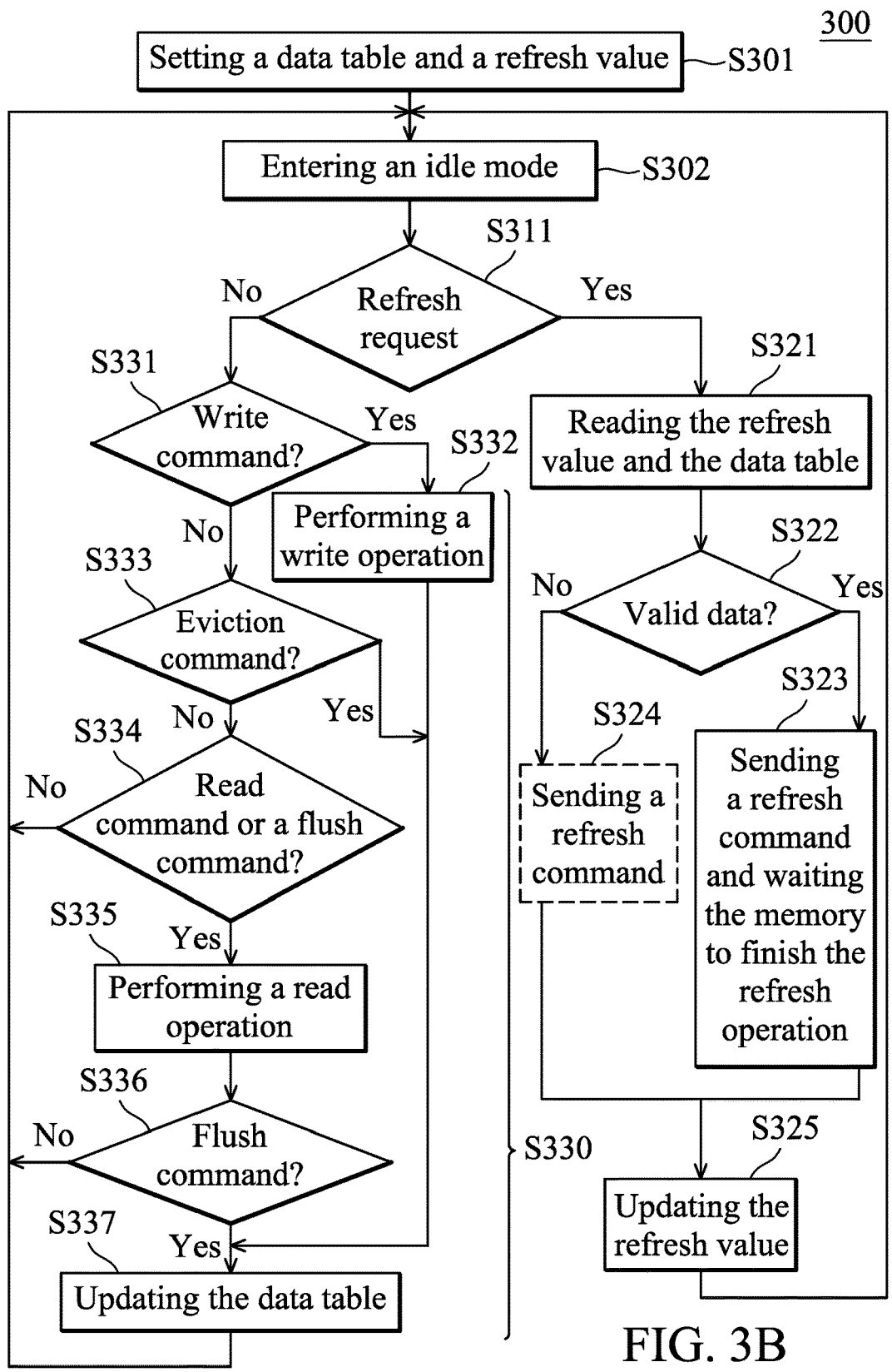
FIG. 3B is a flowchart of another exemplary embodiment of the control method for a memory controller, according to various aspects of the present disclosure.

FIG. 3B is a flowchart of another exemplary embodiment of the control method for a memory controller, according to various aspects of the present disclosure. In this embodiment, the control method 300 further comprises step S301, S302 and S330. Step S301 sets or resets each of the values of the data table to an initial value, such as "0". In another embodiment, step S301 further writes a refresh value into the memory controller. In some embodiments, when the memory controller comprises a counter circuit, step S301 resets the counter value of the counter circuit so that the counter value of the counter circuit is equal to an initial value.

Next, an idle mode is entered (step S302). In the idle mode, the memory controller waits for an external command. Then, the memory controller determines whether a refresh request is issued (step S311). When the refresh request is issued, steps S321~S325 are executed. Since the features of steps S321~S325 shown in FIG. 3B are the same as the features of steps S321~S325 shown in FIG. 3A, the descriptions of the steps S321~S325 shown in FIG. 3B are omitted. In this embodiment, after step S325, the memory controller enters the idle mode again (step S302).

However, when the refresh request is not issued and the memory controller receives an external command, the memory controller accesses the external memory according to the external command (step S330). Step S330 comprises steps S331~S337. Step S331 determines whether the external command is a write command. If the external command is a write command, the memory controller enters a write mode to perform a write operation on the external memory (step S332) and updates the values of the data table (step S337). In one embodiment, when external data is written into a specific memory block, the memory controller changes the value of the bit corresponding to the specific memory block according to the write address of the write command.

For example, when the external data is written into the specific memory block, the memory controller changes the value of a specific bit of the data table from 0 to 1, wherein the specific bit corresponds to the specific memory block. In this case, the value of a bit is 0, which indicates that a corresponding memory block does not store any data or stores invalid data. However, when the value of a bit is 1, this indicates that a corresponding memory block stores valid data.

When the external command is not a write command, step S333 determines whether the external command is an eviction command. When the external command is an eviction command, it means that a specific memory block stores invalid data. Therefore, the memory controller enters an eviction mode. In the eviction mode, the memory controller changes the value of the corresponding bit (step S337). In one embodiment, the memory controller changes the value of the bit corresponding to the specific memory block from 1 to 0 according the eviction address of the eviction command. In other embodiments, when the external memory also comprises a data table, step S337 further synchronizes the data table of the external memory such that the values of the data table stored in the external memory are the same as the values of the data table stored in the memory controller. In this case, the data table stored in the external memory also records whether the memory blocks store valid data.

When the external command is not an eviction command, step S334 determines whether the external command is a read command or a flush command. If the external command is not a read command or a flush command, step S302 is executed to enter the idle mode. When the external command is a read command or a flush command, the memory controller enters a read mode (step S335). In the read mode, the memory controller reads at least one memory block disposed in the external memory.

Then, step S336 determines whether the external command is a flush command. When the external command is not a flush command, step S302 is executed to enter the idle mode. However, when the external command is a flush command, it means that the data stored in a specific memory block will be moved to another external memory, such as a hard disk drive (HDD). Therefore, the memory controller enters a flush mode. In this mode, the memory controller changes the value of the bit of the data table according to the flush address of the flush command. For example, the value of the bit corresponding to the specific memory block is changed to 0.

Figure 4A:
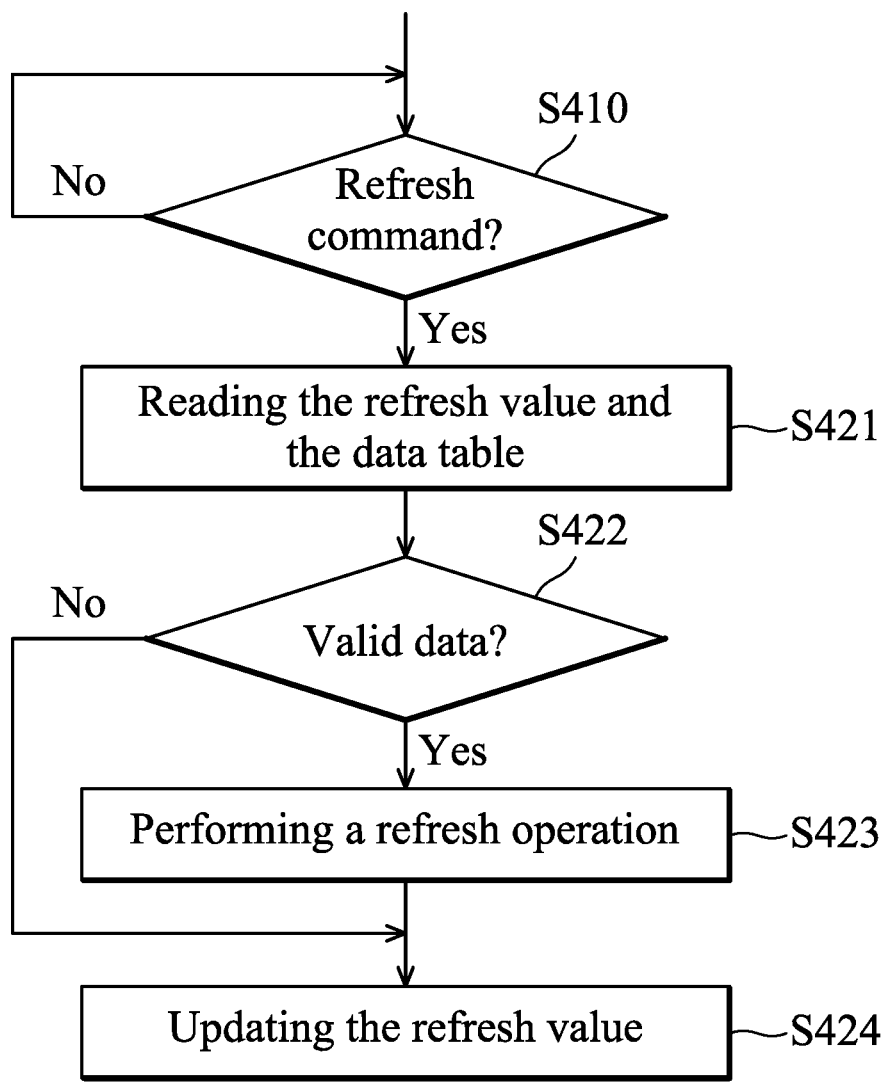
FIG. 4A is a flowchart of an exemplary embodiment of a control method for a memory, according to various aspects of the present disclosure.

FIG. 4A is a flowchart of an exemplary embodiment of a control method for a memory, according to various aspects of the present disclosure. The control method is capable of applying to a memory. According to a command issued from the memory controller, the memory provides read data to a memory controller, or stores external data provided by the memory controller. In one embodiment, the memory comprises a plurality of memory blocks.

First, step S410 determines whether a refresh command is received. In this embodiment, the refresh command is provided by the memory controller. When the memory receives the refresh command, the memory reads a refresh value and a data table (step S421). In this embodiment, the memory stores a refresh value and a data table. In one embodiment, the memory comprises a refresh address register to store the refresh value. In this case, the memory controller also comprises a refresh address register and a data table. The value stored in the refresh address register of the memory and the values of the data table disposed in the memory synchronize the value stored in the refresh address register of the memory controller and the values of the data table disposed in the memory controller. When the memory controller updates the value of the refresh address register of the memory controller or the values of the data table disposed in the memory controller, the memory also synchronizes the value of the refresh address register of the memory or the values of the data table disposed in the memory. Therefore, the value of the refresh address register of the memory or the values of the data table disposed in the memory are the same as the value of the refresh address register of the memory controller or the values of the data table disposed in the memory controller. In one embodiment, the time at which the memory controller updates the value of the refresh address register of the memory controller or the values of the data table disposed in the memory controller is a little earlier than the time at which the memory updates the value of the refresh address register of the memory or the values of the data table disposed in the memory.

The memory selects a specific memory block among a plurality of memory blocks disposed in the memory according to the refresh value, and determines whether the specific memory block stores valid data according to the corresponding bit of the data table disposed in the memory (step S422). In one embodiment, the data table disposed in the memory has a plurality of bits. In this case, the value of each bit indicates whether a corresponding memory block stores valid data. For example, when the value of a bit is 1, it means that the corresponding memory block stores valid data. However, when the value of another bit is 0, it means that the corresponding memory block does not store any data or stores invalid data.

In this embodiment, when the memory utilizes the data table to obtain that the specific memory block stores valid data, the memory perform a refresh operation on the specific memory block (step S423) and then updates the refresh value (step S424). When the specific memory block does not store any data or stores invalid data, the memory directly updates the refresh value (step S424). Therefore, the memory selects another memory block when the next refresh request is issued. Since the memory performs a refresh operation only on the memory block storing valid data, the total refresh time is reduced. Additionally, since the memory does not perform a refresh operation on the memory block which does not store any data or stores invalid data, the memory can perform another access operation immediately. Therefore, the operational efficiency of the memory can be increased.

Figure 4B:
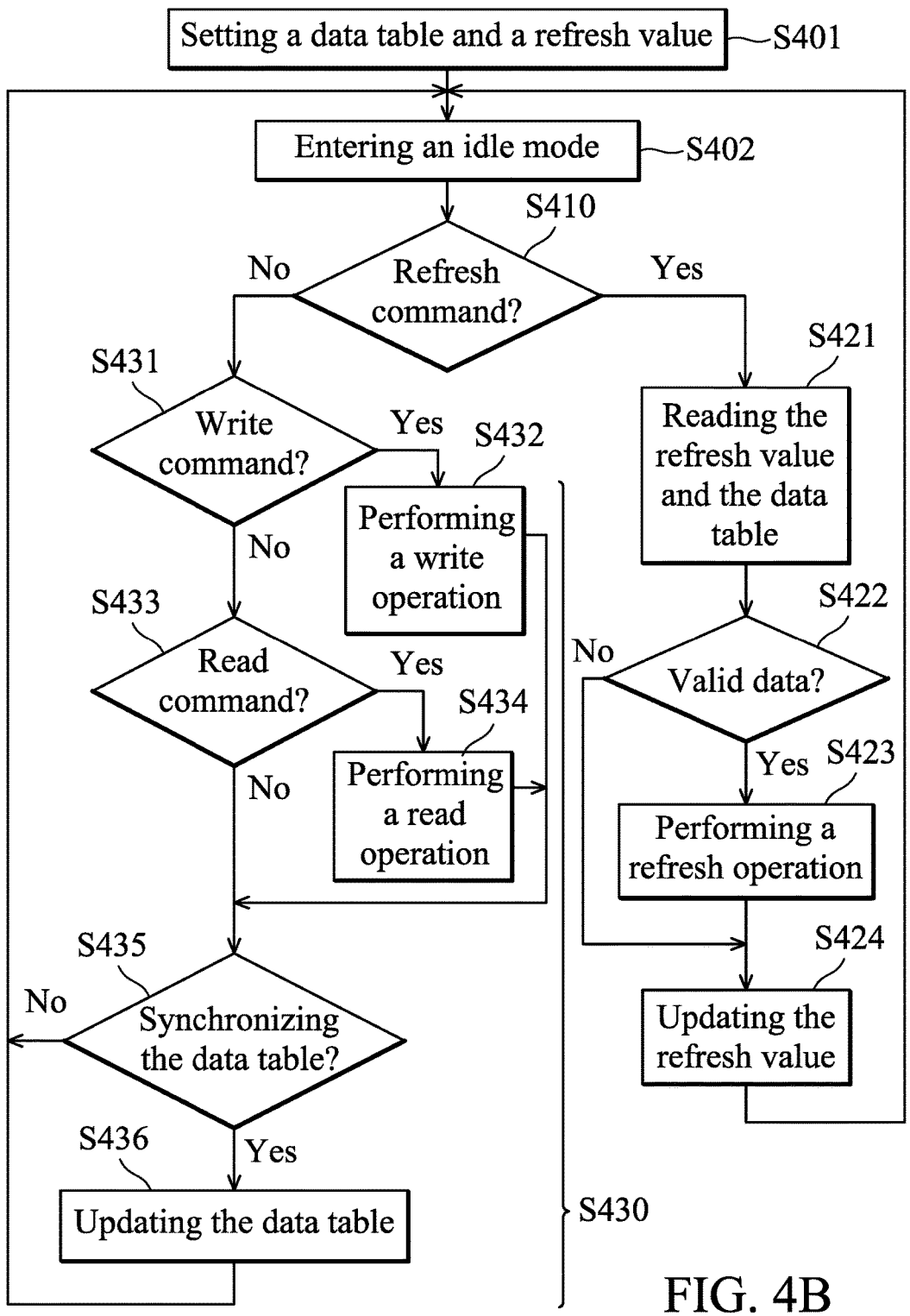
FIG. 4B is a flowchart of another exemplary embodiment of the control method for a memory, according to various aspects of the present disclosure.

FIG. 4B is a flowchart of another exemplary embodiment of the control method for a memory, according to various aspects of the present disclosure. FIG. 4B is similar to FIG. 4A except that the control method of FIG. 4B further comprises steps S401, S402 and S430. Step S401 sets or resets each of the values of the data table disposed in the memory to an initial value, such as "0". In other embodiments, step S401 further write a refresh value to a refresh address register. In some embodiments, step S401 resets a counter value of a counter circuit disposed in the memory such that the counter value of the counter circuit is equal to an initial value. In this case, the counter value of the counter circuit is provided as a refresh value. The memory selects the memory block which the refresh operation is performed on according to the refresh value.

Next, an idle mode is entered (step S402). Then, it is determined whether a refresh command is received. When the control command sent from the memory controller is a refresh command, steps S421~S424 are executed to perform a refresh operation on the memory block storing valid data. However, no refresh operation is performed on the memory block which does not store any data or stores invalid data. In this embodiment, after step S424, the memory enters the idle mode again (step S402).

When the memory controller issues other control commands, the memory accesses the memory blocks according to the type of the control commands (step S430). Step S430 comprises steps S431~S436. Step S431 determines whether the control command is a write command. If the control command is a write command, the memory enters a write mode to write external data to at least one memory block (step S432) and determines whether to synchronize the values of the data table with the values of the data table disposed in the memory controller (step S435). In one embodiment, each bit of the data table corresponds to a specific memory block. Therefore, when the external data is written to a specific memory block, the memory updates the value of the specific bit corresponding to the specific memory block. For example, the memory changes the value of the specific bit of the data table from 0 to 1, wherein the specific bit corresponds to the specific memory block.

When the control command is not a write command, step S433 is executed to determine whether the control command is a read command. If the control command is a read command, the memory enters a read mode (step S434). In the read mode, the memory reads data, which is stored in at least one memory block. In one embodiment, the memory provides the data read from at least one memory block to the memory controller. However, if the control command is not a read command, step S435 is executed to determine whether to synchronize the values of the data table with the values of the data table disposed in the memory controller. In one embodiment, step S435 determines whether the control command is a specific control command which is sent when the memory controller operates in the write mode, the eviction mode or the flush mode.

When the control command is a write command sent from the memory controller in the write mode, since external data is written into at least one memory block, the memory changes the data table (step S436). Additionally, when the control command is an eviction command sent from the memory controller operating in the eviction mode or is a flush command sent from the memory controller operating in the flush mode, since the data stored in at least one memory block is invalidated, the memory changes the data table (step S436). However, when the control command is a read command, since data stored in the memory blocks is not changed, the data table is not changed. Therefore, step S402 is executed.

Since the data table disposed in the memory controller is the same as the data table disposed in the memory, when the memory controller selects a specific memory block and the specific memory block does not store any data or stores invalid data, the memory does not perform a refresh operation on the specific memory block. Therefore, the memory controller can immediately send another control command, and the memory can immediately receive and perform this control command. Since the memory controller has no need to wait the memory to perform the refresh operation, the operational efficiency of the memory controller is increased. Furthermore, since the memory has no need to perform a refresh operation for every memory block, the operational efficiency of the memory is also increased.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Control methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A memory controller accessing a memory comprising a plurality of memory blocks, comprising:
    a storage circuit storing a first refresh value and a first data table; and
    a control circuit accessing the memory blocks and changing the first data table according to a plurality of external commands, wherein the first data table comprises a plurality of bits, and each bit has a value that indicates whether a corresponding memory block stores valid data,
    wherein in a refresh mode, the control circuit selects a specific memory block among the memory blocks according to the first refresh value and determines whether the specific memory block stores valid data according to the first data table,
    wherein when the specific memory block stores valid data, the control circuit sends a refresh command to the memory and, after a first waiting time, the control circuit continuously accesses the memory,
    wherein when the specific memory block does not store any data or stores invalid data, the control circuit sends the refresh command and, after a second waiting time, the control circuit continuously accesses the memory,
    wherein the second waiting time is shorter than the first waiting time.

2. The memory controller as claimed in claim 1, wherein the control circuit sends the refresh command to the memory according to an input clock, the first waiting time is longer than a clock cycle of the input clock, and the second waiting time is equal to the clock cycle.

3. The memory controller as claimed in claim 1, wherein during the first waiting time, the memory performs a refresh operation on the specific memory block, and during the second waiting time, the memory does not perform the refresh operation on the specific memory block.

4. The memory controller as claimed in claim 1, wherein the storage circuit comprises:
    a refresh address register configured to store the first refresh value.

5. The memory controller as claimed in claim 1, wherein the storage circuit comprises:

a counter circuit having a counter value, wherein the counter value serves as the first refresh value.

6. The memory controller as claimed in claim 5, wherein after the first waiting time, the control circuit updates the counter value.

7. The memory controller as claimed in claim 1, wherein in a write mode, the control circuit sends a write command to the memory to write external data to at least one of the memory blocks, and in the write mode, the control circuit updates the first data table according to a write address of the write command.

8. The memory controller as claimed in claim 1, wherein in a read mode, the control circuit sends a read command to the memory to read at least one of the memory blocks, and in the read mode, the control circuit does not change the first data table.

9. The memory controller as claimed in claim 1, wherein when the control circuit receives an eviction command, the control circuit updates the first data table according to an eviction address of the eviction command.

10. The memory controller as claimed in claim 1, wherein when the control circuit receives a flush command, the control circuit updates the first data table according to a flush address of the flush command.

11. The memory controller as claimed in claim 1, wherein the memory stores a second refresh value and a second data table, the second refresh value is the same as the first refresh value, and the second data table is the same as the first data table.

12. A control method for a memory controller which accesses a memory comprising a plurality of memory blocks, comprising:
    determining whether a refresh request is issued;
    when the refresh request is issued, a refresh value is read to select a specific memory block among the memory blocks;
    reading a data table to determine whether the specific memory block stores valid data;
    sending a refresh command to the memory and, after a first waiting time, accessing the memory when the specific memory block stores valid data;
    sending the refresh command to the memory and, after a second waiting time, accessing the memory when the specific memory block does not store any data or stores invalid data; and
    updating the refresh value,
    wherein the second waiting time is shorter than the first waiting time.

13. The control method as claimed in claim 12, further comprising:
    sending the refresh command to the memory according to an input clock, wherein the first waiting time is longer than a clock cycle of the input clock, and the second waiting time is equal to the clock cycle of the input clock.

14. The control method as claimed in claim 12, wherein during the first waiting time, the memory performs a refresh operation on the specific memory block, and during the second waiting time, the memory does not perform the refresh operation on the specific memory block.

15. The control method as claimed in claim 12, further comprising:
    disposing a counter circuit in the memory controller, wherein the counter circuit has a counter value, and the counter value is provided as the refresh value.

16. The control method as claimed in claim 15, wherein when the refresh request is issued, the counter value is updated.

17. The control method as claimed in claim 15, further comprising:
    during an initial period, resetting the data table and the refresh value.

18. The control method as claimed in claim 12, further comprising:
    in a write mode:
        sending a write command to the memory to write external data to at least one of the memory blocks; and
        updating the data table according to a write address of the write command.

19. The control method as claimed in claim 12, further comprising:
    in a read mode:
        sending a read command to the memory to read at least one of the memory blocks, wherein the data table is not changed.

20. The control method as claimed in claim 12, further comprising:
    determining whether an eviction command is received, wherein when the eviction command is received, the data table is updated according to an eviction address of the eviction command.

21. The control method as claimed in claim 12, further comprising:
    determining whether a flush command is received, wherein when the flush command is received, the data table is updated according to a flush address of the flush command.

22. A memory coupled to a memory controller, comprising:
    a plurality of memory blocks configured to store data;
    a storage circuit storing a first refresh value and a first data table; and
    a control circuit accessing the memory blocks and updating the first data table, wherein the first data table comprises a plurality of bits, and each bit indicates whether a corresponding memory block stores valid data,
    wherein when the control circuit receives a refresh command, the control circuit selects a specific memory block among the memory blocks according to the first refresh value and determines whether the specific memory block stores valid data according to the first data table,
    wherein when the specific memory block stores valid data, the control circuit refreshes the specific memory block, and
    wherein when the specific memory block does not store any data or stores invalid data, the control circuit does not refresh the specific memory block.

23. The memory as claimed in claim 22, wherein the storage circuit comprises:
    a refresh address register configured to store the first refresh value.

24. The memory as claimed in claim 22, wherein the storage circuit comprises:
    a counter circuit that has a counter value provided as the first refresh value.

25. The memory as claimed in claim 24, wherein after the control circuit receives the refresh command, the control circuit updates the counter value.

26. The memory as claimed in claim 22, wherein in a write mode, the control circuit writes external data to at least one of the memory blocks according to a write command, and in the write mode, the control circuit updates the first data table according to a write address of the write command.

27. The memory as claimed in claim 22, wherein in the read mode, the control circuit reads at least one of the memory blocks, and the control circuit does not change the first data table in the read mode.

28. The memory as claimed in claim 22, wherein when the control circuit receives an eviction command, the control circuit updates the first data table according to an eviction address of the eviction command.

29. The memory as claimed in claim 22, wherein when the control circuit receives a flush command, the control circuit updates the first data table according to a flush address of the flush command.

30. The memory as claimed in claim 22, wherein the memory controller stores a second refresh value and a second data table, the second refresh value is the same as the first refresh value, and the second data table is the same as the first data table.

31. A control method for a memory which comprises a plurality of memory blocks and is controlled by a memory controller, comprising:
   determining whether a refresh command is sent from the memory controller, wherein when a refresh command is sent from the memory controller, a refresh value is read to select a specific memory block among the memory blocks;
   reading a data table to determine whether the specific memory block stores valid data, wherein when the specific memory block stores valid data, the specific memory block is refreshed, and when the specific memory block does not store any data or stores invalid data, the specific memory block is not refreshed; and
   updating the refresh value after the refresh value is read.

32. The control method as claimed in claim 31, further comprising:
   disposing a counter circuit in the memory, wherein the counter circuit has a counter value, which is provided as the refresh value.

33. The control method as claimed in claim 32, wherein after the first refresh value is read, the refresh value is updated.

34. The control method as claimed in claim 31, further comprising:
   during an initial period, resetting the data table and the refresh value.

35. The control method as claimed in claim 31, further comprising:
   in a write mode:
      writing external data to at least one of the memory blocks according to a write command; and
      updating the data table according to a write address of the write command.

36. The control method as claimed in claim 31, further comprising:
   in a read mode:
      reading at least one of the memory blocks to generate read data; and
      outputting the read data to the memory controller, wherein in the read mode, the data table is not changed.

37. The control method as claimed in claim 31, further comprising:
   receiving a control command; and
   determining type of the control command, wherein when the control command is a write command, an eviction command or a flush command, the data table is changed.

\* \* \* \* \*